(12) United States Patent
Fulford et al.

(10) Patent No.: US 11,631,671 B2
(45) Date of Patent: Apr. 18, 2023

(54) 3D COMPLEMENTARY METAL OXIDE SEMICONDUCTOR (CMOS) DEVICE AND METHOD OF FORMING THE SAME

(71) Applicant: Tokyo Electron Limited, Tokyo (JP)

(72) Inventors: H. Jim Fulford, Marianna, FL (US); Anton J. Devilliers, Clifton Park, NY (US); Mark I. Gardner, Cedar Creek, TX (US); Daniel Chanemougame, Niskayuna, NY (US); Jeffrey Smith, Clifton Park, NY (US); Lars Liebmann, Mechanicsville, NY (US); Subhadeep Kal, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 101 days.

(21) Appl. No.: 17/136,820

(22) Filed: Dec. 29, 2020

(65) Prior Publication Data
US 2021/0202481 A1 Jul. 1, 2021

Related U.S. Application Data

(60) Provisional application No. 62/956,043, filed on Dec. 31, 2019.

(51) Int. Cl.
*H01L 27/092* (2006.01)
*H01L 29/06* (2006.01)
(Continued)

(52) U.S. Cl.
CPC .. *H01L 27/0922* (2013.01); *H01L 21/823807* (2013.01); *H01L 21/823814* (2013.01);
(Continued)

(58) Field of Classification Search
CPC ......... H01L 27/0922; H01L 21/823807; H01L 21/823814; H01L 29/0665; H01L 29/1608;
(Continued)

(56) References Cited

U.S. PATENT DOCUMENTS

| 2012/0007052 A1* | 1/2012 | Hobbs ................. H01L 27/1211 977/762 |
| 2014/0175561 A1 | 6/2014 | Colinge et al. |

(Continued)

FOREIGN PATENT DOCUMENTS

| KR | 10-2016-0087357 A | 7/2016 |
| WO | WO 2014/099036 A1 | 6/2014 |

OTHER PUBLICATIONS

International Search Report and Written Opinion dated Apr. 26, 2021 in PCT/US2020/067615, 9 pages.

*Primary Examiner* — Tong-Ho Kim
(74) *Attorney, Agent, or Firm* — Oblon, McClelland, Maier & Neustadt, L.L.P.

(57) ABSTRACT

A method of fabricating a semiconductor device is provided. An initial stack of layers is formed over a substrate. The initial stack alternates between a first material layer and a second material layer that has a different composition from the first material layer. The initial stack is divided into a first stack and a second stack. First GAA transistors are formed in the first stack by using the first material layers as respective channel regions for the first GAA transistors and using the second material layers as respective replacement gates for the first GAA transistors. Second GAA transistors are formed in the second stack by using the second material layers as respective channel regions for the second GAA transistors and using the first material layers as respective replacement gates for the second GAA transistors. The second GAA transistors are vertically offset from the first GAA transistors.

23 Claims, 10 Drawing Sheets

(51) Int. Cl.
*H01L 29/423* (2006.01)
*H01L 29/66* (2006.01)
*H01L 29/786* (2006.01)
*H01L 29/16* (2006.01)
*H01L 21/8238* (2006.01)

(52) U.S. Cl.
CPC ...... *H01L 29/0665* (2013.01); *H01L 29/1608* (2013.01); *H01L 29/42392* (2013.01); *H01L 29/66742* (2013.01); *H01L 29/78618* (2013.01); *H01L 29/78696* (2013.01)

(58) Field of Classification Search
CPC ......... H01L 29/42392; H01L 29/66742; H01L 29/78618; H01L 29/78696; H01L 29/0653; H01L 29/0673; H01L 29/66439; H01L 21/8221; H01L 21/823842; H01L 27/0688; H01L 27/092; H01L 29/775; B82Y 10/00

USPC ......................................................... 257/288
See application file for complete search history.

(56) References Cited

U.S. PATENT DOCUMENTS

| | | |
|---|---|---|
| 2015/0069328 A1 | 3/2015 | Leobandung |
| 2016/0035849 A1 | 2/2016 | Ching et al. |
| 2016/0086951 A1* | 3/2016 | Kim ...................... H01L 21/845 438/154 |
| 2018/0174642 A1 | 6/2018 | Huynh Bao et al. |
| 2018/0190544 A1* | 7/2018 | Bi ...................... H01L 21/02532 |
| 2019/0131395 A1* | 5/2019 | Lee ...................... H01L 29/161 |
| 2019/0148376 A1* | 5/2019 | Chanemougame .......................... H01L 21/8221 257/532 |

* cited by examiner

3D COMPLEMENTARY METAL OXIDE SEMICONDUCTOR (CMOS) DEVICE AND METHOD OF FORMING THE SAME

INCORPORATION BY REFERENCE

This present disclosure claims the benefit of U.S. Provisional Application No. 62/956,043, filed on Dec. 31, 2019, the entire content of which is incorporated herein by reference in its entirety.

FIELD OF THE INVENTION

This disclosure relates to integrated circuits and the fabrication of microelectronic devices.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a 3D semiconductor device and a method of fabricating the 3D semiconductor device.

A first aspect is a semiconductor device. The semiconductor device includes a substrate, a first stack of first gate-all-around (GAA) transistors positioned over one another along a thickness direction of the substrate, and a second stack of second GAA transistors positioned over one another along the thickness direction. The first and second GAA transistors can be adjacent to each other in a direction along a surface of the substrate. Each of the first GAA transistors can be vertically offset from a respective adjacent second GAA transistor of the second stack.

In some embodiments, at least one of the first GAA transistors includes a first channel region, a first gate surrounding the first channel region, and first source and drain regions on ends of the first channel regions. At least one of the second GAA transistors includes a second channel region, a second gate surrounding the second channel region, and second source and drain regions on ends of the second channel regions.

In some embodiments, each of the first GAA transistors is vertically offset from a respective adjacent second GAA transistor of the second stack by a thickness of a respective first or second channel region.

In some embodiments, one or more of the first channel regions are chemically different from other first channel regions. In some embodiments, one or more of the second channel regions are chemically different from other second channel regions. In some embodiments, one or more of the first GAA transistors have a different number of first channel regions from other first GAA transistors. In some embodiments, one or more of the second GAA transistors have a different number of second channel regions from other second GAA transistors.

In some embodiments, the first GAA transistors are NMOS. The first channel regions include at least one of single-crystal silicon or silicon carbide. The second GAA transistors are PMOS. The second channel regions include at least one of silicon-germanium or germanium.

In some embodiments, the first GAA transistors are PMOS. The first channel regions include at least one of silicon-germanium or germanium. The second GAA transistors are NMOS. The second channel regions include at least one of single-crystal silicon or silicon carbide.

In some embodiments, the semiconductor device may further include insulating layers that separate the first or second GAA transistors from each other and inner spacers that separate the first or second gates from the corresponding first or second source and drain regions.

A second aspect is a method of fabricating a semiconductor device. The method includes forming an initial stack of layers over a substrate. The initial stack of layers can alternate between a first material layer and a second material layer. The second material layer has a different composition from the first material layer. The initial stack of layers can be patterned so that the initial stack of layers is divided into a first stack and a second stack, where the first stack and the second stack are adjacent to each other. First gate-all-around (GAA) transistors can be formed in the first stack by using the first material layers as respective channel regions for the first GAA transistors and using the second material layers as respective replacement gates for the first GAA transistors. Second GAA transistors can be formed in the second stack by using the second material layers as respective channel regions for the second GAA transistors and using the first material layers as respective replacement gates for the second GAA transistors. The second GAA transistors are vertically offset from the first GAA transistors.

In some embodiments, forming the first GAA transistors includes forming a protective layer over the second stack so that the second stack is covered by the protective layer. A filler material can surround the first stack. A portion of the filler material that abuts the first stack can be removed so that the first stack is exposed from sides. End portions of the second material layers of the first stack are removed to form indentations by selective etching. Inner spacers are formed in the indentations by selective deposition. Local source and drain regions are formed on ends of the first material layers of the first stack. In some embodiments, the filler material is deposited to cover the sides and a top of the first stack, and the filler material is patterned so that the top of the first stack is exposed. The second material layers can be removed from the first stack. Gate layers are formed over the first material layers, and the filler material is deposited to fill the first stack.

In some embodiments, one or more of the local source regions can merge with at least one neighboring local source region to form a common source region, and one or more of the local drain regions can merge with at least one neighboring local drain region to form a common drain region.

In some embodiments, forming the second GAA transistors includes forming a protective layer over the first stack so that the first stack is covered by the protective layer. A filler material can surround the second stack. A portion of the filler material that abuts the second stack can be removed so that the second stack is exposed from sides. End portions of the first material layers of the second stack are removed to form indentations by selective etching. Inner spacers are formed in the indentations by selective deposition. Local source and drain regions are formed on ends of the second material layers of the second stack. In some embodiments, the filler material is deposited to cover the sides and a top of the second stack, and the filler material is patterned so that the top of the second stack is exposed. The first material layers can be removed from the second stack. Gate layers are formed over the second material layers. The filler material is deposited to fill the second stack.

In some embodiments, one or more of the local source regions can merge with at least one neighboring local source region to form a common source region, and one or more of the local drain regions can merge with at least one neighboring local drain region to form a common drain region.

In some embodiments, one or more of the first GAA transistors are connected with one or more of the second GAA transistors.

In some embodiments, the method can further include forming at least one of an etch stop layer on a bottom of the initial stack of layers or a cap layer on a top of the initial stack of layers.

A third aspect is a method of fabricating a semiconductor device. The method includes forming an initial stack of layers over a substrate. The initial stack of layers can include a plurality of substacks that alternate between a first material layer and a second material layer that has a different composition from the first material layer. The plurality of substacks is separated from each other in a height direction. The initial stack of layers can be patterned so that the initial stack of layers is divided into a first stack and a second stack, where the first stack and the second stack are adjacent to each other. First gate-all-around (GAA) transistors can be formed in the first stack by using the first material layers as respective channel regions for the first GAA transistors and using the second material layers as respective replacement gates for the first GAA transistors. Second GAA transistors can be formed in the second stack by using the second material layers as respective channel regions for the second GAA transistors and using the first material layers as respective replacement gates for the second GAA transistors. The second GAA transistors are vertically offset from the first GAA transistors.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
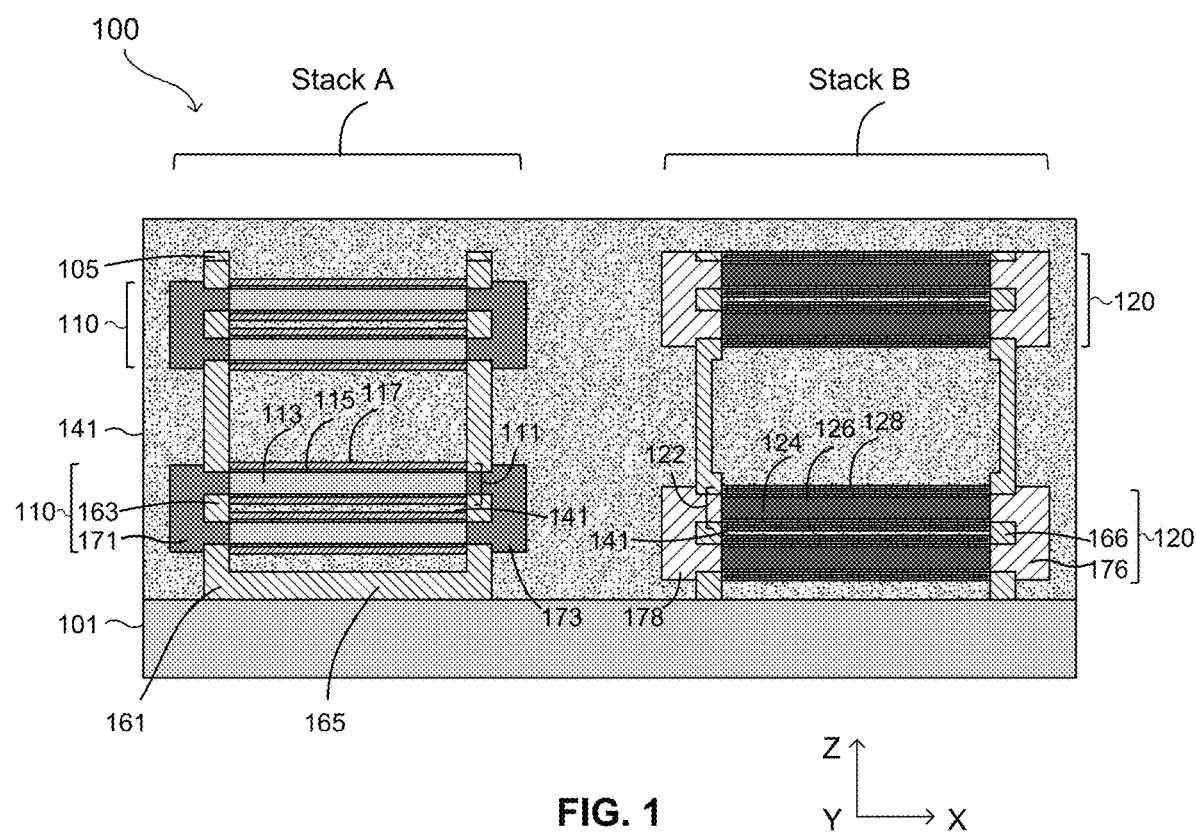
FIG. 1 is a vertical cross-sectional view of a semiconductor device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device (e.g., the semiconductor device) in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

As noted in Background, 3D integration is seen as a viable option to continue semiconductor scaling in spite of inevitable saturation in critical dimension scaling. As the contacted gate pitch reaches its scaling limit due to manufacturing variability and electrostatic device limitations, two-dimensional transistor density scaling stops. Even experimental new transistor designs, such as vertical channel gate-all-around transistors which may be able to one day overcome these contacted gate pitch scaling limits, do not promise to get semiconductor scaling back on track because resistance, capacitance, and reliability concerns limit wire pitch scaling, thereby limiting the density with which transistors can be wired into circuits.

3D integration, i.e., the vertical stacking of multiple devices, aims to overcome these scaling limitations by increasing transistor density in volume rather than area. This idea has been successfully demonstrated and implemented by the flash memory industry with the adoption of 3D NAND. Mainstream CMOS (complementary metal-oxide-semiconductor) VLSI (very large-scale integration) scaling, as used for example in CPU (central processing unit) or GPU (graphics processing unit) products, is exploring adoption of 3D integration as a primary means of moving the semiconductor roadmap forward, and thus desires enabling technologies.

For CMOS (or CFET, complementary field-effect transistor) in particular, balancing the drive current strength between NFET (negative field-effect transistor) and PFET (positive field-effect transistor) has always been a critical point of focus in the industry to ensure optimum CFET circuits operations. In planar technologies, the PFET drive current was about 2 times weaker than the NFET due to lower hole mobility on (100)/[110] crystal surface/direction. To balance that, the solution adopted is to use PFET devices that are 1-2 times bigger than NFET to compensate in logic standard cell and SRAM designs (also known as beta ratio=Wp/Wn). The obvious impact is that the standard cell becomes bigger. The development of process methods to strain the channel and improve N/P balance provided a lot of relief.

Similarly, the N/P balance with the finFET device architecture got much better as the hole mobility on (110/[110] is greatly improved. On top of that, successive generations of process source/drain stressors provided much better boost on the PFET than on the NFET, contributing further to a better N/P balance. The result was that the same number of fins was used between NFET and PFET.

Figure 3:
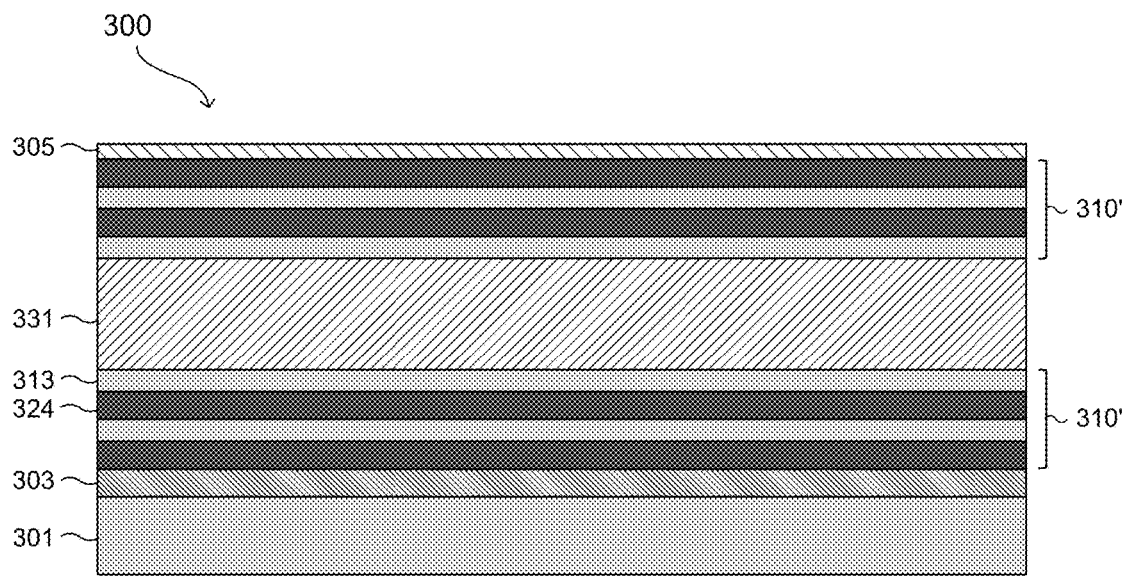
FIGS. 3, 4, 5, 6, 7, 8, 9, 10, 11, 12, 13, and 14 are cross-sectional views of a semiconductor device at various intermediate steps of manufacturing, in accordance with exemplary embodiments of the disclosure.

As the industry transitions to a new device architecture, from finFET to Lateral Gate All Around nanosheet (LGAA NS), electrons and holes charge carriers will be once again dominantly moving along the (100)/[110] crystal surface/direction (FIG. 3). And so similarly to the planar days, there will be a strong N/P drive current imbalance. Additionally, methods to transfer strain from S/D to the channel are much less efficient with LGAA NS, so it is unlikely that the same trick that worked for bulk planar technologies can work again.

There is another defining challenge. Offering a multi-Vt technology (LVT, RVT, HVT, etc.) is very important to customers as it provides greater design flexibility from low power to high performance applications and everything in between. As such, this is a critical competition factor between technology providers: the more the Vt flavors, the better the technology.

In finFET, Vt tuning is achieved through a combination of the metal gate work function (WFM) deposited on the channel, together with some form of channel doping. Among other things, modulation of WFM is achieved through different thickness. That thickness modulation is severely limited in the LGAA NS due to the fixed and limited space between NS. Additionally, consistently doping the channel from the top to bottom NS w/o compromising the device is not possible. Therefore, techniques herein present a method to improve N/P imbalance in LGAA NS and at the same time to provide more Vt-tuning options.

Techniques herein provide methods to form a 3D nanoplane stack that can be used for both NMOS (n-type metal-oxide-semiconductor) and PMOS (p-type metal-oxide-semiconductor) and that is common to both. These techniques enable better performance for NMOS (e.g., Si nanostack) and PMOS (e.g., Ge nanostack). The techniques also enable a denser logic circuit layout. NMOS devices have the best performance (mobility) with both Si and SiC channel regions. Techniques herein provide both channel regions and can stack these elements. Likewise, PMOS devices have the best performance (mobility) with either Ge or SiGe channel regions, and techniques herein can stack these elements. Accordingly, methods herein create a high performance solution that enhances circuit performance.

Techniques herein provide methods to create a unique structure with dual channel materials for NFET and PFET in a LGAA NS architecture: Si channel for NFET and SiGe channel for PFET. The SiGe channel not only can boost the PFET drive current but also offers options to create more Vt options by leveraging the offset in the valence band of the SiGe channel. With SiGe as the PFET channel material, hole mobility is increased as the SiGe layers have intrinsic compressive biaxial strain that benefits hole mobility and helps with the N/P current imbalance. Additionally, SiGe layers with 25% Ge can present a 200 meV offset in the valence energy band due to the presence of Ge, leading to 200 mV reduction of Vt compared to Si. That reduction can be used to obtain extra Vt flavors such super and extra low Vt.

FIG. 1 is a vertical cross-sectional view of a semiconductor device 100, in accordance with exemplary embodiments of the disclosure. The semiconductor device 100 has a substrate 101 (e.g., silicon) and two stacks (Stack A and Stack B) over the substrate 101. The two stacks are adjacent to each other and separated by an insulating material 141 such as silicon oxide. While the semiconductor device 100 shows only two stacks for convenience, the semiconductor device 100 typically can have more than two stacks arranged along the x and/or y directions in some embodiments.

As shown in FIG. 1, Stack A includes first gate-all-around (GAA) transistors 110 (also referred to as first transistors) that are separated from each other by the insulating material 141 in the z direction. In this example, the first transistors 110 are NMOS including first GAA channel structures 111 that are separated from each other by the insulating material 141 in the z direction. Each of the first GAA channel structures 111 has a first channel region 113 (e.g., silicon or silicon carbide) and a first gate layer 117 (e.g., TiAlN or TiAlC) all around the first channel region 113. The first GAA channel structure 111 also has a gate dielectric layer 115 (e.g., a high-k dielectric such as hafnium oxide) also surrounding the first channel and disposed between the first channel region 113 and the first gate layer 117. The first channel regions 113 can be a slab, a cylinder, or of another geometric shape.

In the embodiment of FIG. 1, each of the first transistors 110 includes two first GAA channel structures 111. Further, each of the first transistors 110 includes first common source/drain (S/D) regions 171 and 173 disposed on opposing ends of the first channel regions 113. For example, 171 can be the common source region, and 173 can be the common drain region. Alternatively, 171 can be the common drain region, and 173 can be the common source region. While the first common S/D regions 171 and 173 are connected to the two first channel regions 113 in the example of FIG. 1, in some embodiments, first local S/D regions (not shown) that are separated from each other are formed to connect to a respective channel region 113 only. As a result, two neighboring first channel regions 113 can be used to form two transistors (not shown) stacked in the Z direction. As seen, within each of the first transistors 110, the first common S/D regions 171 and 173 are connected to the two first channel regions 113 and separated from the first gate layers 117 by a first inner spacer 161 that can be made of an insulating material such as silicon nitride. The first inner spacer 161 has a plurality of vertical portions 163 and a horizontal portion 165. In some embodiments, the horizontal portion 165 may not be necessary. Additionally, Stack A includes a top layer 105 that is a portion of what serves as a cap layer during manufacturing, and the top layer 105 may be not necessary in some embodiments.

Similar to Stack A, Stack B includes second GAA transistors 120 (also referred to as second transistors) that are separated from each other by the insulating material 141 in the z direction. In this example, the second transistors 120 are PMOS including second gate-all-around (GAA) channel structures 122 that are separated from each other by the insulating material 141 in the z direction. Each of the second GAA channel structures 122 has a second channel region 124 (e.g., germanium or silicon-germanium) and a second gate layer 128 (e.g., titanium nitride) all around the second channel region 124. The second GAA channel structure 122 also has a gate dielectric layer 126 (e.g., a high-k dielectric such as hafnium oxide) also surrounding the first channel and disposed between the second channel region 124 and the second gate layer 128. The second channel regions 124 can be a slab, a cylinder, or of another geometric shape.

Similarly, each of the second transistors 120 includes second common S/D regions 176 and 178 disposed on opposing ends of the second channel regions 124. The second common S/D regions 176 and 178 are both connected to the two second channel regions 124 and separated from the second gate layers 128 by a second inner spacer 166. The second inner spacer 166 may be made of a same insulating material as the first inner spacer 161. In alternative embodiments, second local S/D regions can be formed so that two neighboring second channel regions 124 can be used to form two transistors stacked in the Z direction (not shown).

Still in FIG. 1, in alternative embodiments, the first transistors 110 can be PMOS, and the second transistors 120 can be NMSO. While Stack A and Stack B are demonstrated to have two first transistors 110 and two second transistors 120, respectively, any number of first transistors 110 and second transistors 120 can be stacked vertically in the corresponding stack and separated from each other by the insulating material 141. Further, the first transistors 110 and the second transistors 120 can have any number of first GAA channel structures 111 and second GAA channel structures 122, respectively, to meet specific design requirements. In some embodiments, one or more of the first transistors 110 can have a different number of first GAA channel structures 111 from other first transistors 110. In some embodiments, one or more of the second transistors 120 can have a different number of second GAA channel structures 122 from other second transistors 120.

While the first channel regions 113 are made of a same material in the FIG. 1 example, in some embodiments, one or more of the first channel regions 113 can be chemically different from other first channel regions 113 so that the first transistors can have different threshold voltage ($V_t$) from each other. In one example, one or more of the first channel regions 113 may be intrinsic silicon, and other first channel regions 113 may be doped silicon. In another example, one or more of the first channel regions 113 may have a different n-type dopant (e.g., boron, indium, etc.) or a different dopant concentration. Similarly, in some embodiments, one or more of the second channel regions 124 can be chemically different from other second channel regions 124 so that the second transistors 120 can have different threshold voltage ($V_t$) from each other. In one example, one or more of the second channel regions 124 may be germanium (Ge), and other second channel regions 124 may be silicon-germanium (SiGe). In another example, one or more of the second channel regions 124 may have a different ratio of Si to Ge.

As seen in FIG. 1, the transistors 110 of Stack A are vertically offset from the respective adjacent second transistors 120 of Stack B. This offset results from the use of a common stack of alternating material layers to form both the NMOS transistors of Stack A and the PMOS transistors of Stack B, as discussed further below.

Figure 2A:
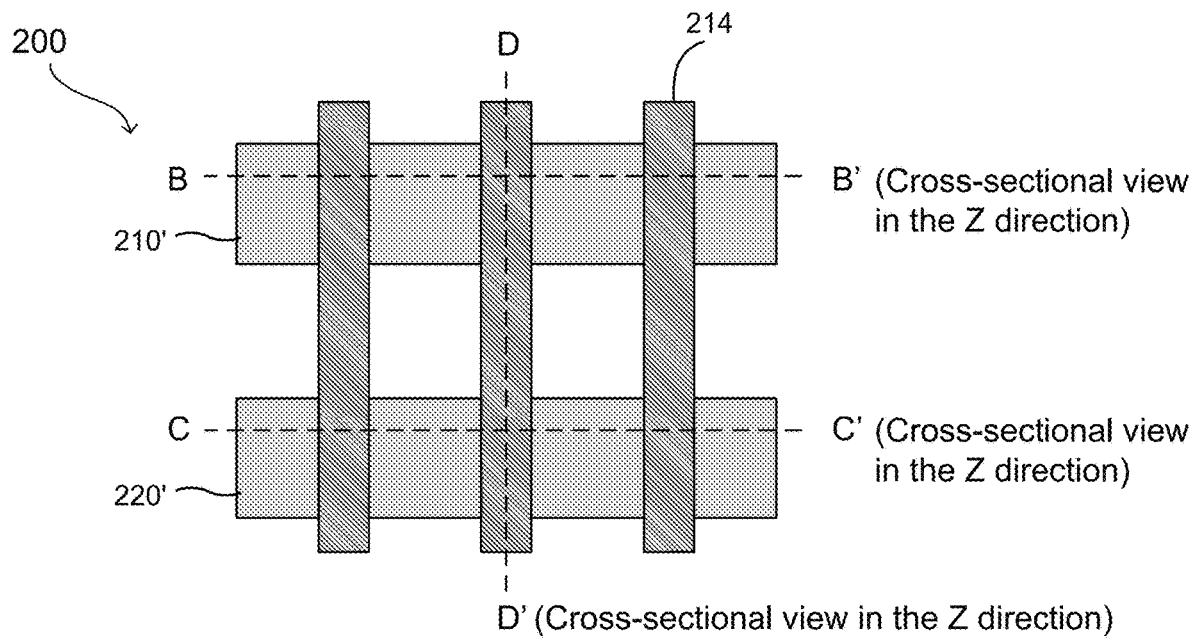
FIG. 2A is a top-down view of a semiconductor device, in accordance with exemplary embodiments of the disclosure.

FIG. 2A is a top-down view of a semiconductor device 200, in accordance with exemplary embodiments of the disclosure. Since the embodiment of the semiconductor device 200 is similar to the embodiment of the semiconductor device 100 in FIG. 1, explanation will be given with emphasis placed upon differences. As shown, the semiconductor device 200 can include a first array 210' of first GAA transistors (not shown) and a second array 220' of second GAA transistors (not shown). The first array 210' and the second array 220' can, for example, extend in the Y direction and be adjacent to each other. The semiconductor device 200 can also include gate structures 214 extending in the Z direction.

Figure 2B:
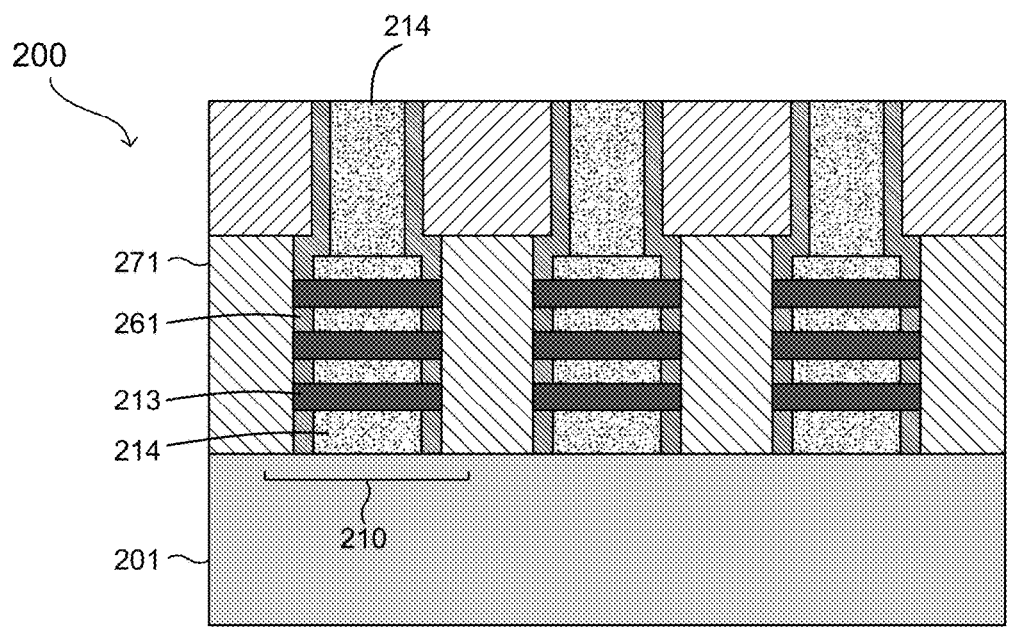
FIGS. 2B, 2C, and 2D are vertical cross-sectional views taken along line cuts BB', CC', and DD' in FIG. 2A, respectively, in accordance with exemplary embodiments of the disclosure.
Figure 2C:
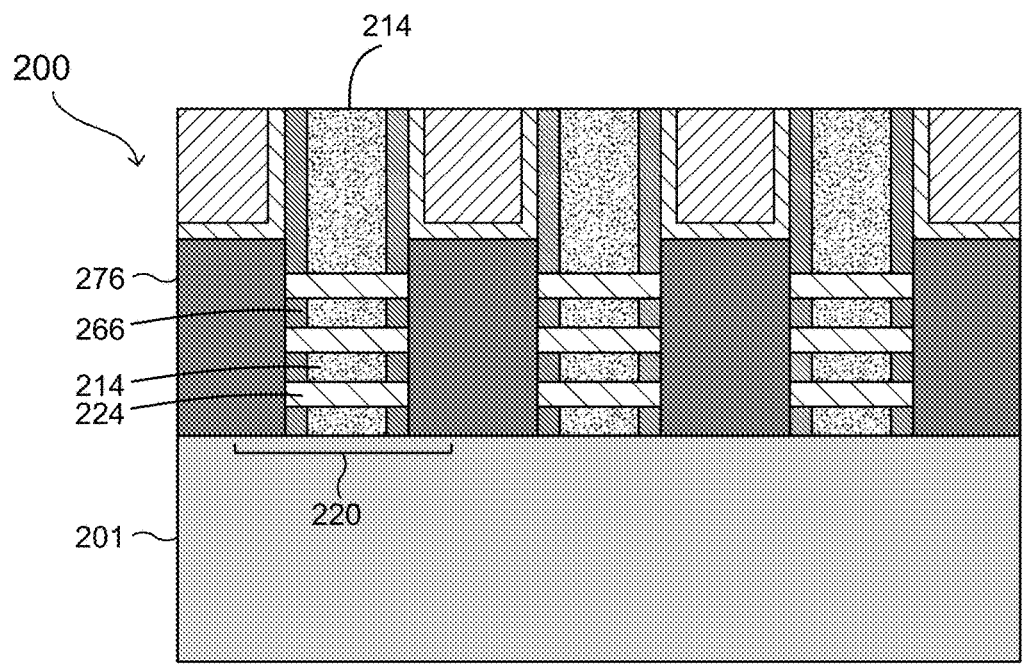
Figure 2D:
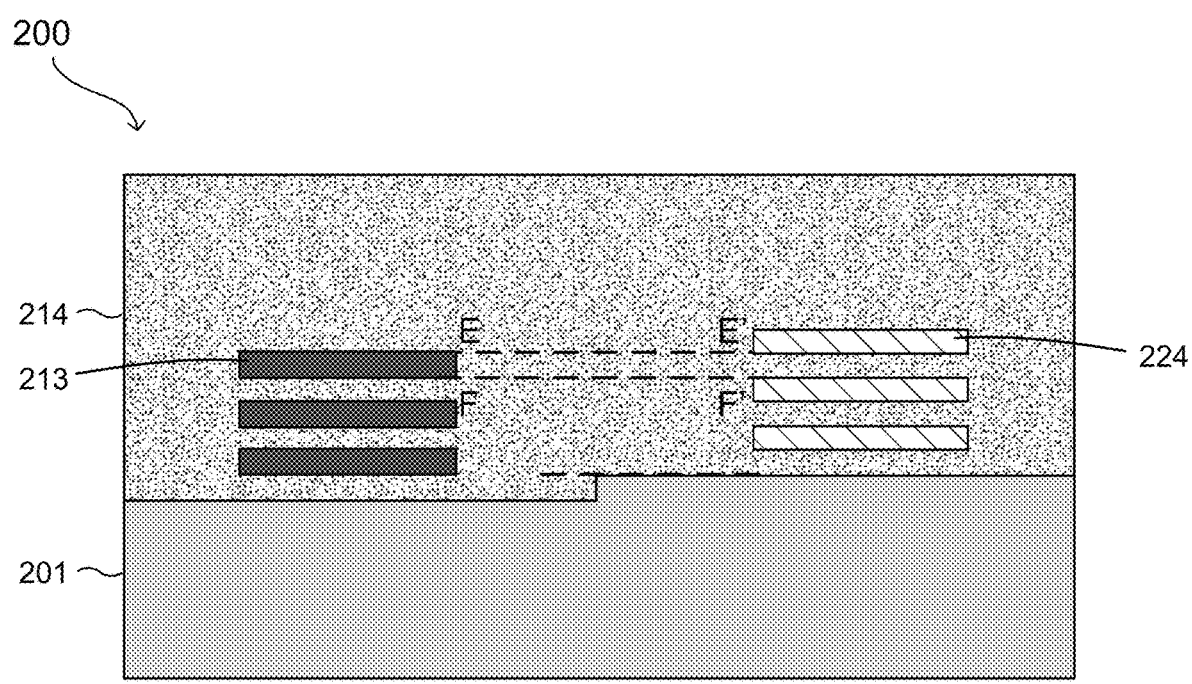

FIGS. 2B, 2C, and 2D are vertical cross-sectional views taken along line cuts BB', CC', and DD' in FIG. 2A, respectively, in accordance with exemplary embodiments of the disclosure. As illustrated, the first array 210' can include one or more first GAA transistors 210. In the example of FIG. 2B, three first GAA transistors 210 are connected in series and have first common S/D regions 271. Each of the first GAA transistor 210 has three first channel regions 213 and first gate structures 214 all around the first channel structures 213. The gate structures 214 are separated from the first common S/D regions 271 by first inner spacers 261. While not shown, a gate structure 214 of a particular first channel region 213 can be separated from a gate structure 214 of a neighboring first channel region 213, similar to the semiconductor device 100 in FIG. 1. In some embodiments, the gate structures 214 can include a gate dielectric layer and a work function metal.

The second GAA transistors 220 are similar to the first GAA transistors 210, except that the second GAA transistors 220 include second channel regions 224, second common S/D regions 276, and second inner spacers 266. Note that in the examples of FIGS. 2A-2D, the first GAA transistors 210 and the second GAA transistors 220 are respectively connected in series, and the first common S/D regions 271 and the second common S/D regions 276 can connect two neighboring transistors. In other embodiments, the first GAA transistors 210 and the second GAA transistors 220 may be separated from each other. In this example, the first GAA transistors 210 and the second GAA transistors 220 are PMOS and NMOS, respectively. Alternatively, the first GAA transistors 210 and the second GAA transistors 220 can be NMOS and PMOS, respectively. In this example, the first common S/D regions 271 connect the three first channel regions 213 that are stacked in the Z direction so each first GAA transistor 210 includes three first channel regions 213.

In other embodiments, first local S/D regions (not shown) that are separated from each other may be disposed on ends of the first channel regions 213. As a result, three transistors (not shown) can be stacked in the Z direction.

Further, the first channel regions 213 and the second channel regions 224 are vertically offset by a thickness of a respective first channel region 213 or a respective second channel region 224, as demonstrated by lines EE' and FF' in FIG. 2D. Note that in this embodiment, the semiconductor device 200 is originally formed from a common stack that alternates between a first material layer and a second material layer that correspond to the first channel region 213 and the second channel region 224, respectively. This offset results from the use of the common stack to form both the first GAA transistors 210 and the second GAA transistors 220, as will be discussed further below. Further, in some embodiments, one or more pairs of the alternating first material layers and second material layers may be separated from other pairs by one or more third material layers.

Figure 15:
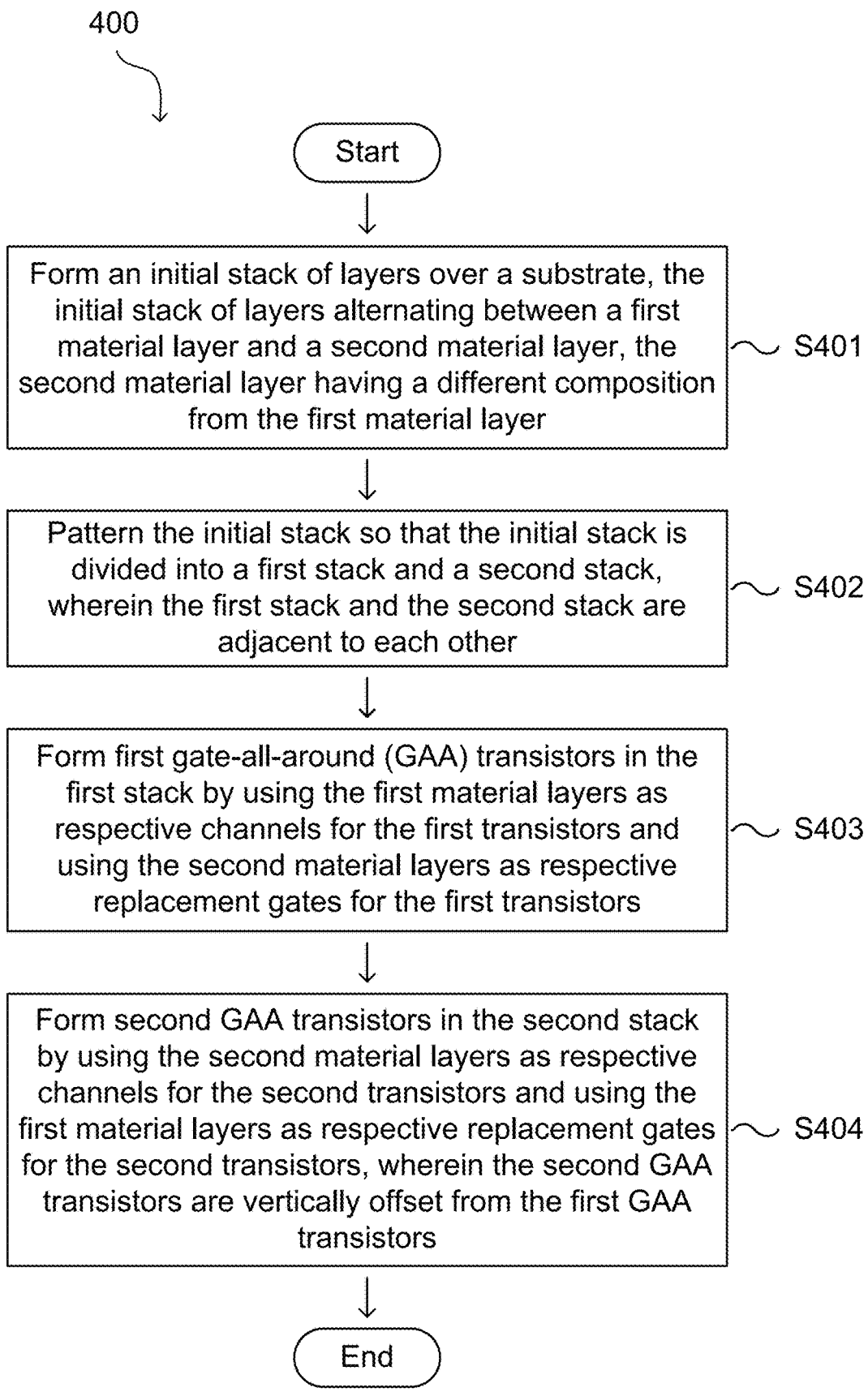
FIG. 15 shows a flow chart of an exemplary process of manufacturing an exemplary semiconductor device, in accordance with embodiments of the disclosure.

FIG. 15 shows a flow chart of an exemplary method 400 of manufacturing an exemplary semiconductor device such as the semiconductor device 100, the semiconductor device 200, and the like, in accordance with embodiments of the disclosure. The method 400 starts with step S401 where an initial stack of layers is formed over a substrate of the semiconductor device. The initial stack alternates between a first material layer and a second material layer. The second material layer has a different composition from the first material layer. In some embodiments, the initial stack can include a plurality of substacks that alternate between a first material layer and a second material layer. The plurality of substacks can be separated from each other in a height direction. Similar to the semiconductor device 100 and the semiconductor device 200, the initial stack herein can have various embodiments. The descriptions have been provided above and will be omitted here for simplicity purposes.

The method then proceeds to step S402 where the initial stack is patterned so that the initial stack can be divided into a first stack and a second stack, where the first stack and the second stack are adjacent to each other. It should be understood that the initial stack can also be divided into more than two stacks.

At step S403, first gate-all-around (GAA) transistors are formed in the first stack by using the first material layers as respective channels for the first transistors and using the second material layers as respective replacement gates for the first transistors. First, a protective layer is formed over the second stack so that the second stack is covered by the protective layer. A filler material can surround the first stack. Then, a portion of the filler material that abuts the first stack can be removed so that the first stack is exposed from sides. Subsequently, end portions of the second material layers of the first stack are removed to form indentations by selective etching. Next, inner spacers are formed in the indentations by selective deposition, and source and drain regions are formed on ends of the first material layers of the first stack. In order to form gate layers, the filler material is deposited to cover the sides and a top of the first stack, prior to being patterned to expose the top of the first stack. In some embodiments, sacrificial layers can separate the plurality of substacks from each other in the height direction. Then, the second channel regions and the sacrificial layers are removed from the first stack. Subsequently, the gate layers are formed over the first material layers. Next, the filler material is deposited to fill the first stack.

At step S404, second GAA transistors are formed in the second stack by using the second material layers as respective channels for the second transistors and using the first material layers as respective replacement gates for the second transistors. The second GAA transistors are vertically offset from the first GAA transistors. The second GAA transistors can be formed in a similar way to the first GAA transistors. The resultant semiconductor device can be similar to the semiconductor device 100. The descriptions have been provided above and will be omitted here for simplicity purposes.

FIGS. 3-14 are cross-sectional views of a semiconductor device 300 at various intermediate steps of a manufacturing process such as the method 400 and the like, in accordance with exemplary embodiments of the disclosure. Particularly, FIGS. 3-10 show formation of first transistors such as NMOS, and FIGS. 11-14 show formation of second transistors such as PMOS.

FIG. 3 shows the semiconductor device 300 that will eventually become the semiconductor device 100 in FIG. 1. As illustrated, an initial stack of layers is formed over a substrate 301 (e.g., silicon) of the semiconductor device 300. In a primary example, the initial stack includes two substacks 310' that alternate between a first material layer 313 and a second material layer 324 and a sacrificial layer 331 that separates the two substacks 310' from each other in the z direction. The initial stack also includes an etch stop layer 303 on a bottom and a cap layer 305 on a top. In this example, the first material layers 313 are made of single-crystal silicon (noted as Si), and the second material layers 324 are made of silicon-germanium (noted as SiGe2). The etch stop layer 303 and the sacrificial layer 331 are also made of silicon-germanium and noted as SiGe3 and SiGe4, respectively. SiGe2, SiGe3, and SiGe4 are chemically different from each other so that SiGe2, SiGe3, and SiGe4 can have etching selectivity and deposition selectivity during subsequent processing steps. For example, SiGe2, SiGe3, and SiGe4 can have different ratios of Si to Ge. Further, the cap layer is made of silicon oxide and silicon nitride.

Note that while the following descriptions will use the primary example described above to illustrate the manufacturing process, there are many other embodiments of the semiconductor device 300. For example, the semiconductor device 300 can have more than two substacks 310' that are separated from each other by the sacrificial layer 331 in the z direction. The substacks 310' may have any number of alternating first material layers 313 and second material layers 324 to meet specific design requirements. In some embodiments, one or more of the substacks 310' can have a different number of first material layers 313 from other substacks 310'. In some embodiments, one or more of the substacks 310' can have a different number of second material layers 324 from other substacks 310'.

In alternative embodiments, the first material layers 313 can be made of doped silicon or silicon carbide (SiC), and the second material layers 324 can be made of Ge. Further, in some embodiments, one or more of the first material layers 313 can be chemically different from other first material layers 313. In one example, one or more of the first material layers 313 are intrinsic Si, and other first material layers 313 are doped silicon or SiC. In another example, one or more of the first material layers 313 may have a different n-type dopant (e.g., boron, indium, etc.) or a different dopant concentration. Similarly, in some embodiments, one or more of the second material layers 324 can be chemically different from other second material layers 324. In one example, one or more of the second material layers 324 are Ge, and other second material layers 324 are SiGe. In another example, one or more of the second material layers 324 may have a different ration of Si to Ge.

Additionally, the etch stop layer 303 and the sacrificial layer 331 may be made of materials other than silicon-germanium. The initial stack is designed such that the etch stop layer 303, the sacrificial layer 331, the first material layer 313, and the second material layer 324 are chemically different from each other. As a result, the etch stop layer 303, the sacrificial layer 331, the first material layer 313, and the second material layer 324 can have etching selectivity and deposition selectivity during subsequent processing steps.

Referring back to the primary example, the semiconductor device 300 will enable creation of two adjacent nanostacks with different channel materials for NMOS and PMOS using one common nanostack formed by epitaxial growth. The flow begins with alternating epitaxial stacks of silicon/silicon-germanium/silicon/silicon-germanium and then forms a stack of Si nanoplanes (NMOS devices) adjacent to a stack of SiGe2 nanoplanes (PMOS devices).

Figure 4:
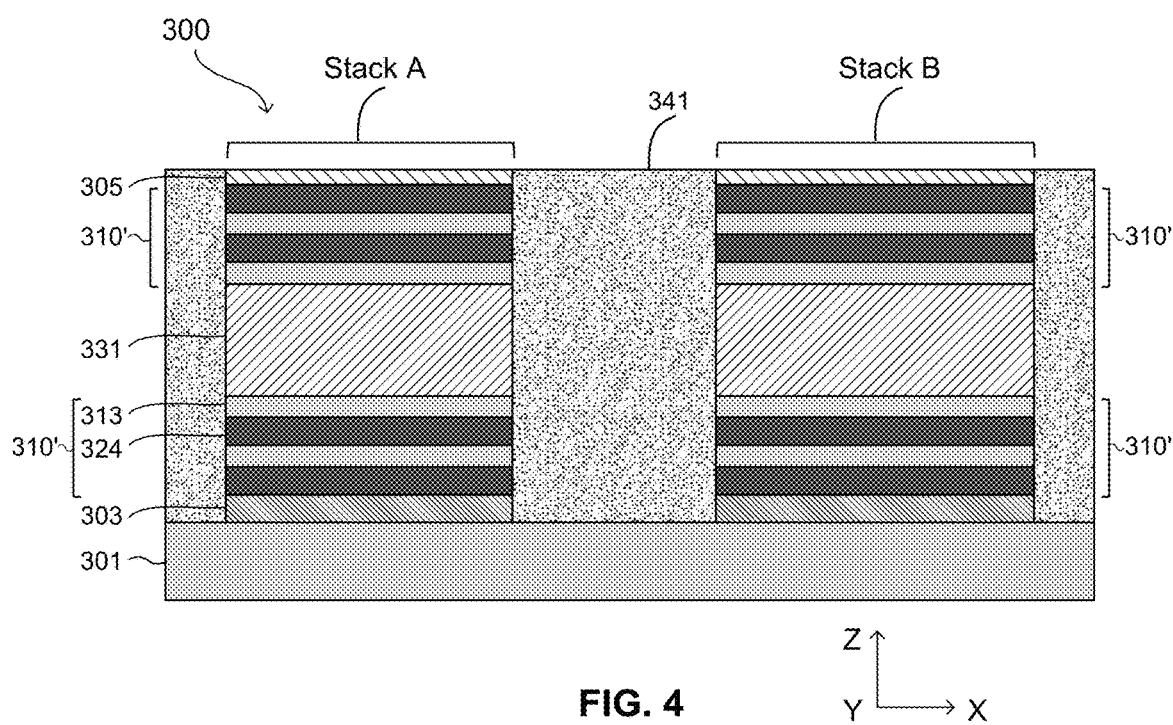

In FIG. 4, the initial stack is patterned so that the initial stack is divided into a first stack (noted as Stack A) and a second stack (noted as Stack B) wherein Stack A and Stack B are separated by a filler material 341. As a result, both Stack A and Stack B include the substacks 310'. Photolithography can be used to pattern the initial stack. For example, a mask (not shown) can be formed on the initial stack, and the initial stack can be etched using the mask to form two nanosheet stacks (Stack A and Stack B). The semiconductor device 300 is then filled with oxide or another dielectric and then polished, for instance by chemical-mechanical planarization (CMP), to form the filler material 341. Note that Stack A will be a future NMOS stack while Stack B will be a future PMOS stack in the primary example. Of course, Stack A can be a future PMOS stack while Stack B can be a future NMOS stack in an alternative example. Additionally, the initial stack can be divided into more than two stacks in other embodiments.

Figure 5:
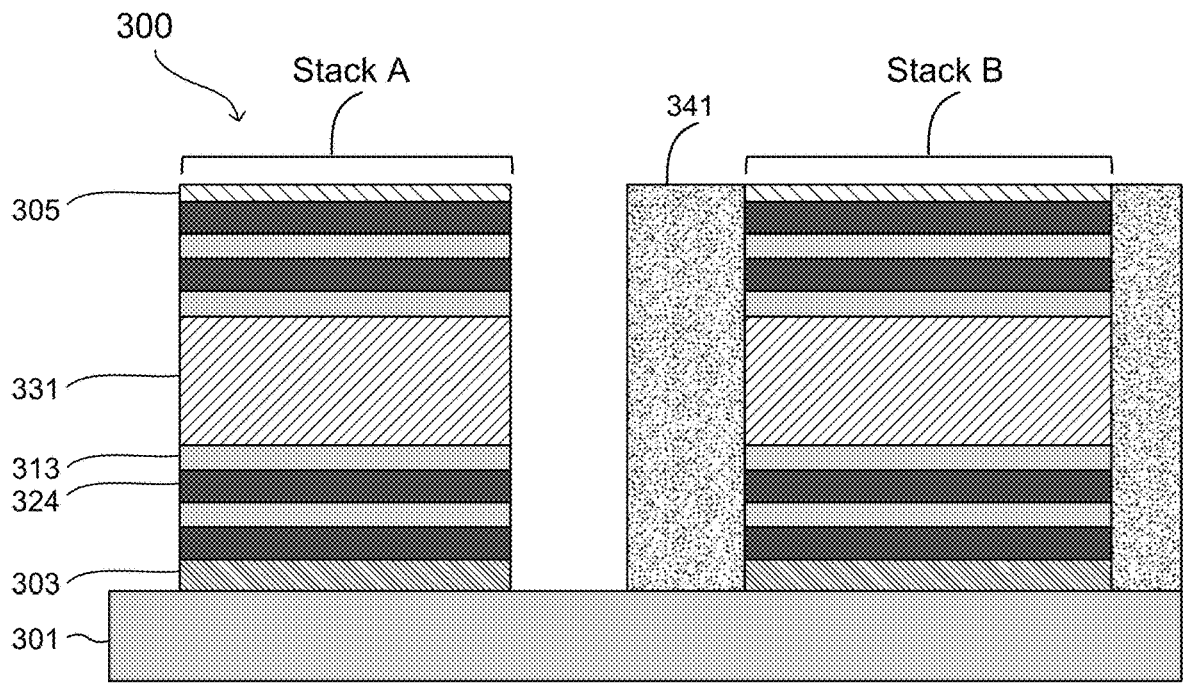

In FIG. 5, a protective layer (not shown) can be formed over Stack B so that Stack B is covered by the protective layer and the filler material 341. The protective layer can, for example, be a patterned layer of photoresist or a hardmask material. Subsequently, a portion of the filler material 341 that abuts Stack A is removed using the protective layer as an etching mask. Consequently, Stack A is exposed from sides.

Figure 6:
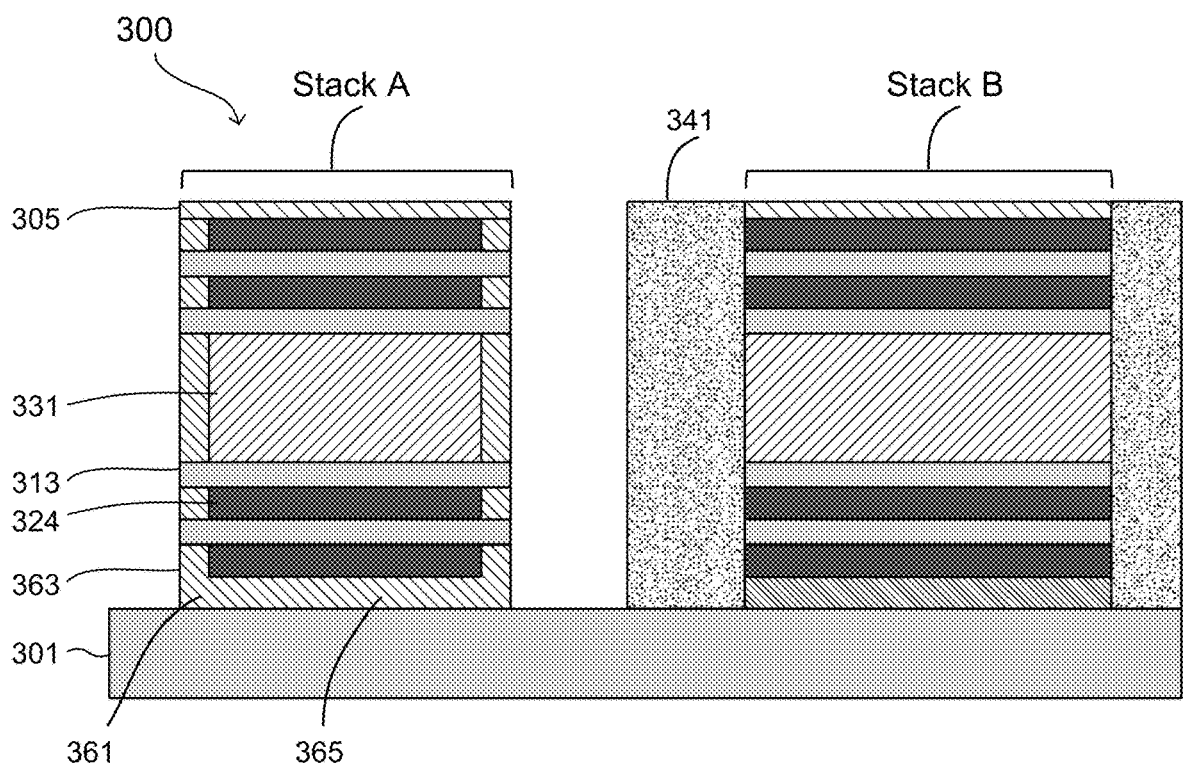

In FIG. 6, end portions of the second material layers 324 of Stack A are removed to form indentations by selective etching. Note that each different epitaxial material composition/compound can be etched selectively to other layers using vapor phase etching. In the primary example, SiGe2, SiGe3, SiGe4, and Si are chemically different from each other so that SiGe2, SiGe3, and SiGe4 can be selectively etched. Tools, such as Certas from Tokyo Electron, can be used for such targeted, isotropic etching. In some embodiments, etching of SiGe3 and SiGe3 may not be necessary. After indentation etching, first inner spacers 361 are formed in the indentations of Stack A. The first inner spacers 361 include an insulating material that is chemically different from the first material layers 313, the second material layers 324, the sacrificial layer 331, and the etch stop layer 303. In this example, the first inner spacers 361 are made of silicon nitride (SiN). The first inner spacers 361 have a plurality of vertical portions 363 and a horizontal portion 365. In some embodiments, the horizontal portion 365 may not be necessary. Note that the first material layers 313 can extend beyond the second material layers 324 in future S/D regions of Stack A.

Figure 7:
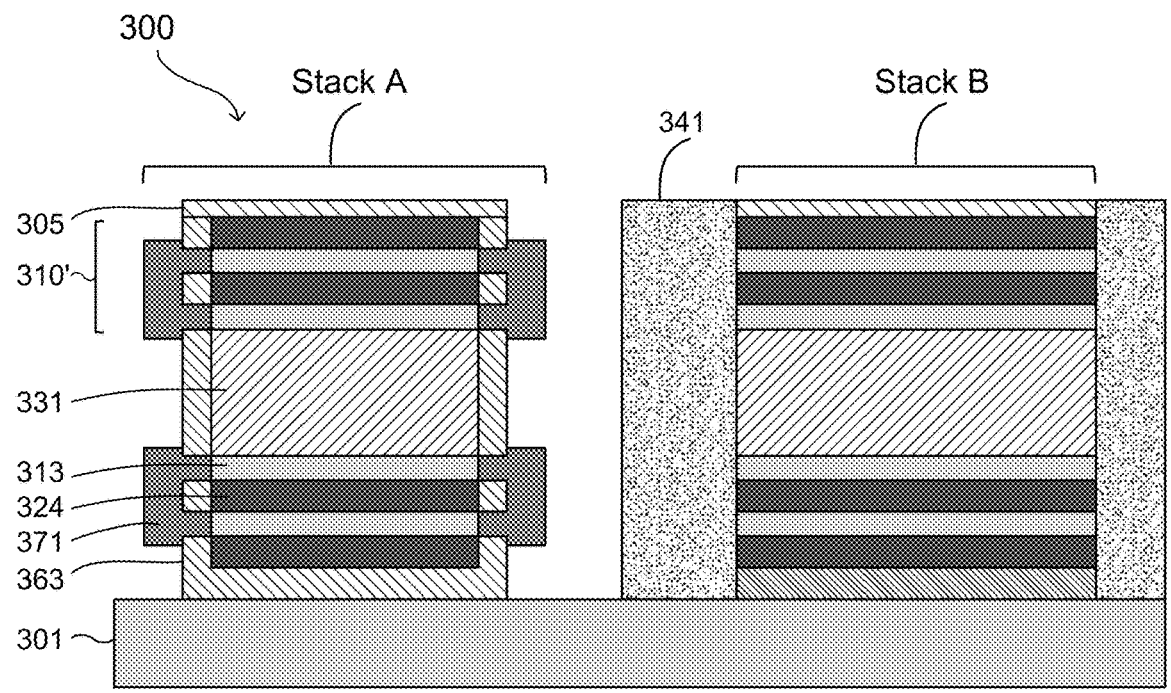

In FIG. 7, a first S/D material 371 is selectively deposited on ends of the first material layers 313 of Stack A. In the primary example, with channel ends uncovered, N+ or N-doped S/D regions 371 can be formed by epitaxial growth for the NMOS stack (Stack A). In the example discussed in FIG. 6, SiGe2, SiGe4, the first inner spacers 361 (e.g., SiN), and the first material layers 313 (e.g., Si) are chemically different from each other so that selective deposition can be performed on the first material layers 313). In this example, vertically adjacent first S/D regions 371 can be connected or grown together within each substack 310' and can therefore be referred to as first common S/D regions. In some embodiments, the vertically adjacent first S/D regions may be separated from each other within a particular substack 310' (not shown) and can therefore be referred to as first local S/D regions. Moreover, end portions of the first material layers 313 of Stack A can be converted to and integrally formed with the first S/D regions 371 as illustrated. An annealing process can be performed to diffuse n-type dopants from the first S/D regions 371 to the end portions of the first material layers 313 of Stack A. In some embodiments, converting the end portions of the first material layers 313 of Stack A to the first S/D regions 371 may not be necessary.

Figure 8:
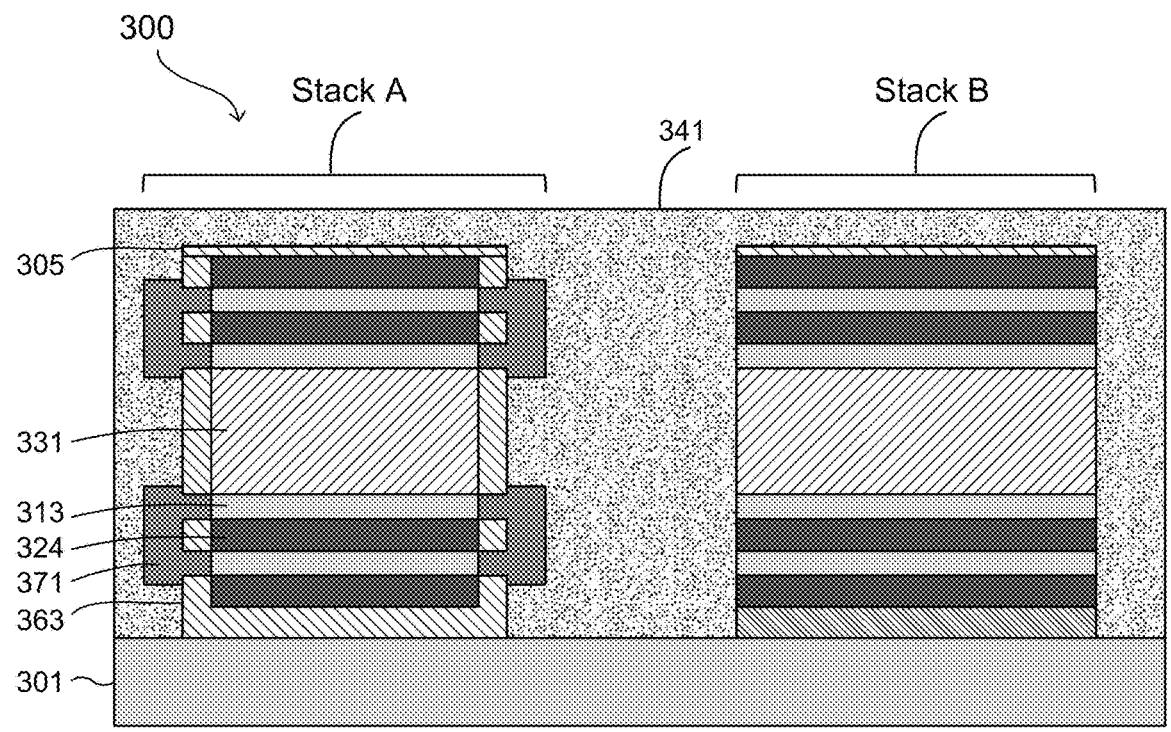

In FIG. 8, the filler material 341 is deposited to cover the sides and a top of Stack A. A CMP process can then be performed to planarize the filler material 341.

Figure 9:
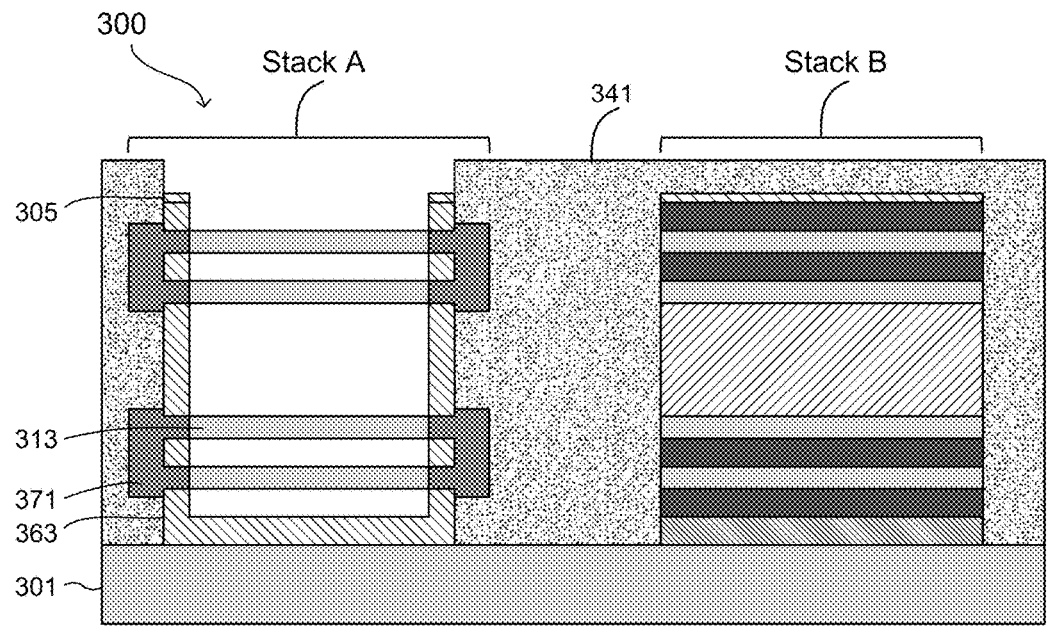

In FIG. 9, the filler material 341 is patterned so that the top of Stack A is exposed. Then, the second material layers 324, the sacrificial layers 331, and a portion of the cap layer 305 are removed from Stack A. In the primary example, the filler material 341 (e.g., oxide) can then be deposited over the substrate 301 to cover the N+S/D regions (Stack A). An etching mask (not shown) is formed to open up the NMOS channel release region (e.g., the first material layers 313), and the filler material 341 therein is etched. The etching mask can then be removed, followed by SiGe2 and SiGe4 etch in Stack A. At this point, future NMOS regions only have desired Si channels (e.g., the first material layers 313). In some embodiments, the cap layer 305 may be completely removed from Stack A.

Figure 10:
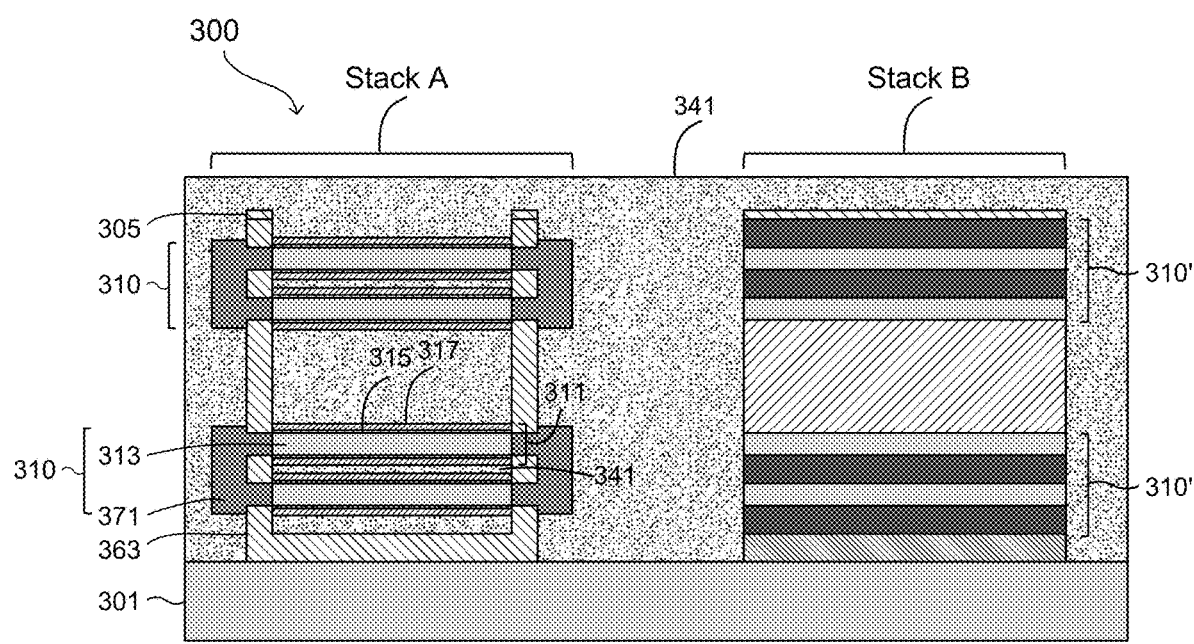

In FIG. 10, first gate layers that include a first gate dielectric 315 and a first metal 317 are formed over the first material layers 313. As a result, a first GAA channel structure 311 that includes the first material layer 313, the first gate dielectric 315, and the first metal 317 is formed. Herein, the first material layers 313 function as first channels. Moreover, a first transistor 310 that includes two first GAA channel structures 311 is formed (based on the original substack 310'). In this example, the first gate dielectric 315 is a high-k dielectric such as hafnium oxide, and the first metal 317 is an n-type gate metal electrode such as TiAlN and/or TiAlC. On the NMOS side (Stack A), high-k deposition can be executed as well as dual metal gate electrode sequence. At this point in processing, NMOS transistors 310 are complete. Subsequently, the NMOS stack (Stack A) is filled and covered with the filler material 341, and the filler material 341 can be planarized or polished by CMP.

FIGS. 11-14 show a process of forming second transistors, such as PMOS in the primary example. Since FIGS. 11-14 shows a similar process to FIGS. 3-10, explanation will be given with emphasis placed upon differences.

Figure 11:
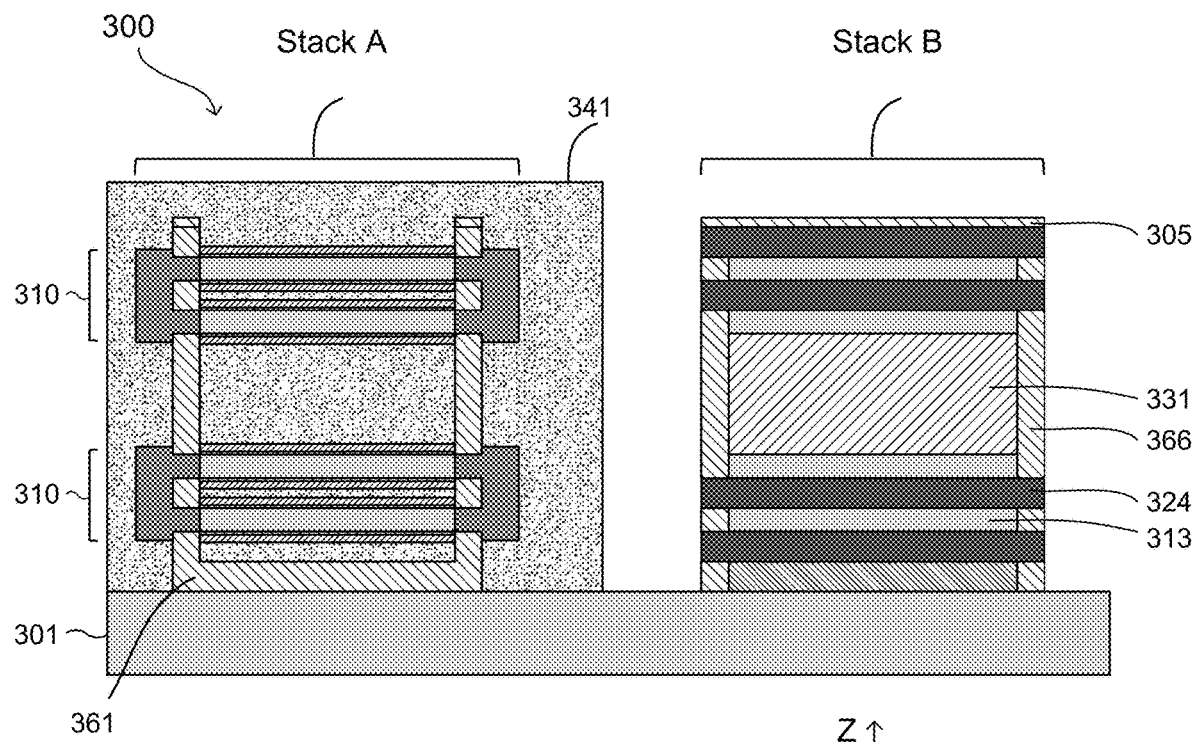

In FIG. 11, second inner spacers 366 are formed in indentations of the first material layers 313. Similar to the first inner spacers 361, the second inner spacers 366 can be formed by forming a protective layer (not shown) over Stack A, removing a portion of the filler material 341 to expose Stack B from sides, removing end portions of the first material layers 313 of Stack B to form indentations by selective etching, and forming the second inner spacers 366 in the indentations by selective deposition. In the primary example, the NMOS stack (Stack A) is masked while the filler material 341 on the PMOS stack (Stack B) is etched to open up PMOS regions. The etching mask is removed, followed by indentation etch of the first material layers 313 and formation of the second inner spacer 366. The second inner spacer 366 is made of a same material as the first inner spacer 361. Note that the second material layers 324 can extend beyond the first material layers 313 in the future S/D regions. In this example, the second inner spacers 366 are also formed in indentations of the sacrificial layer 331. In some embodiments, formation of the second inner spacers 366 in indentations of the sacrificial layer 331 may not be necessary. In some embodiments, the second inner spacer 366 may be made of a different material from the first inner spacer 361.

Figure 12:
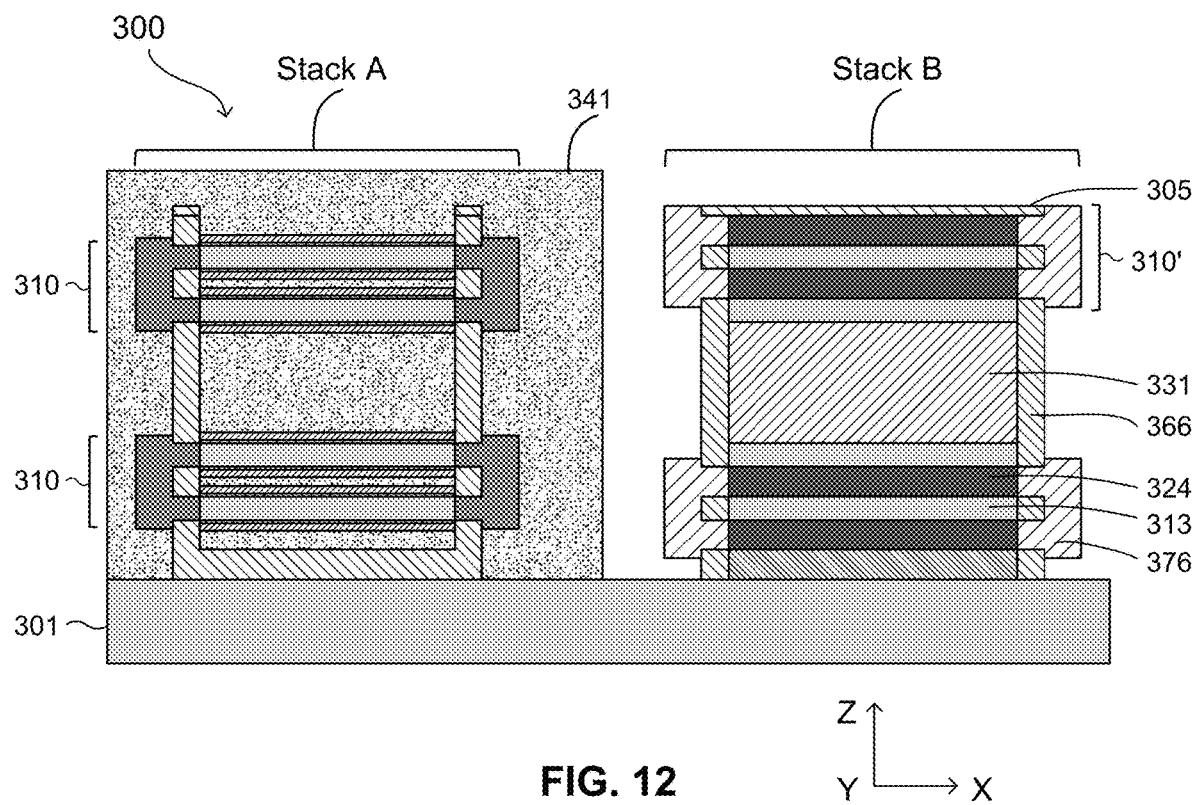

In FIG. 12, a second S/D material 376 is selectively deposited on the ends of the second material layers 324 of Stack B. In the primary example, with channel ends uncovered, P+ or P-doped S/D regions 376 can be formed by epitaxial growth for the PMOS stack (Stack B). In this example, vertically adjacent second S/D regions 376 can be connected or grown together within each substack 310' and can therefore be referred to as second common S/D regions. In some embodiments, the vertically adjacent second S/D regions may be separated from each other within a particular substack 310' (not shown) and can therefore be referred to as second local S/D regions. Similar to the first S/D regions 371, end portions of the second material layers 324 of Stack B can be converted to and integrally formed with the second S/D regions 376 as illustrated, for example by an annealing process. In some embodiments, converting the end portions of the second material layers 324 of Stack B to the S/D regions 376 may not be necessary.

Figure 13:
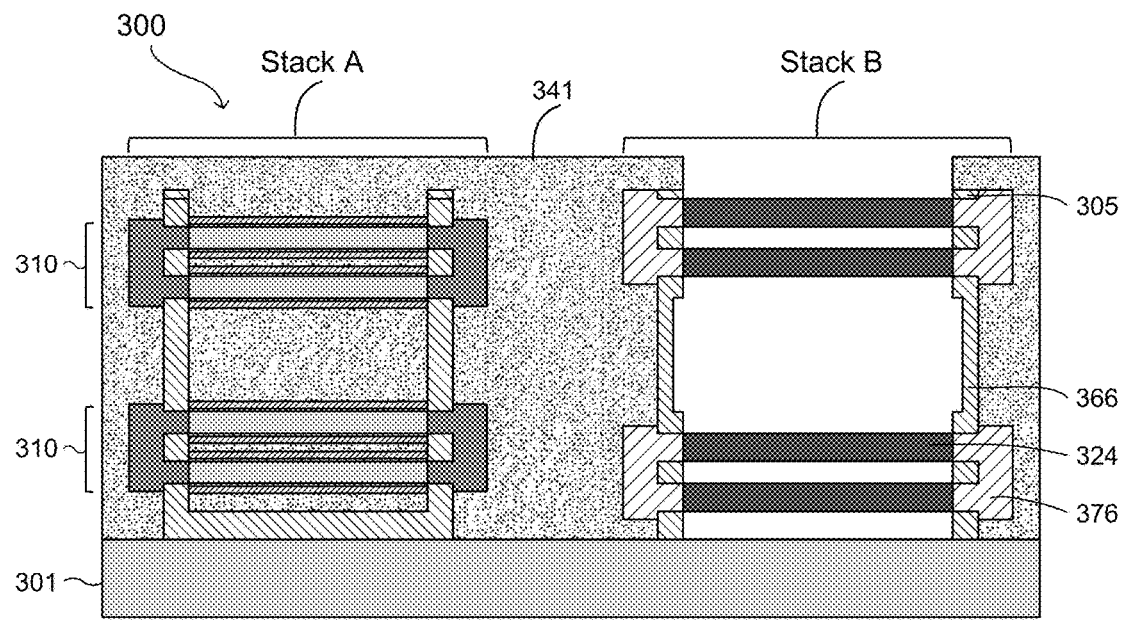

In FIG. 13, the second material layers 324 are exposed. Similarly, the second material layers 324 can be exposed by depositing the filler material 341 to cover the sides and a top of Stack B, patterning the filler material 341 to expose the top of Stack B, and removing the first material layers 313, the sacrificial layers 331, and a portion of the cap layer 305 from Stack B. In the primary example, the filler material 341 can then be deposited on the substrate 301 to cover the P+ S/D regions (Stack B). An etching mask (not shown) is formed to open up the PMOS channel release region (e.g., the second material layer 324), and the filler material 341 therein is etched. The etching mask can then be removed, followed by etching the first material layers 313 and the sacrificial layer 331 in Stack B. At this point, future PMOS regions only have desired SiGe2 channels (e.g., the second material layers 324). In some embodiments, the cap layer 305 may be completely removed from Stack A.

Figure 14:
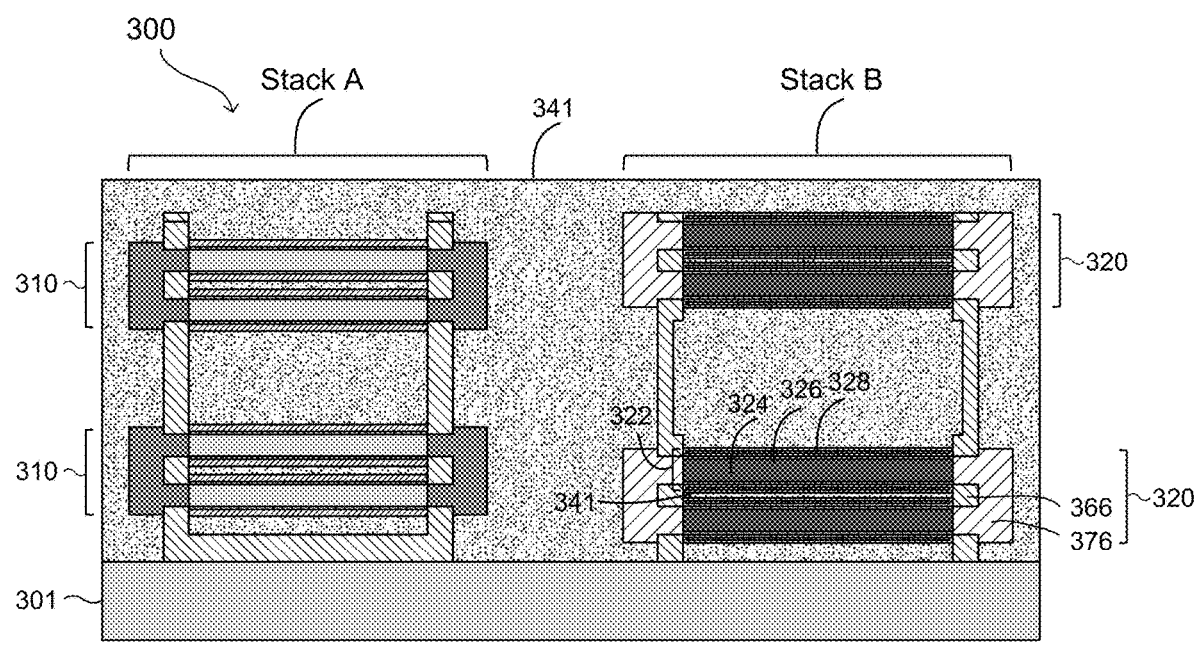

In FIG. 14, second gate layers that include a second gate dielectric 326 and a second metal 328 are formed over the second material layers 324. As a result, a second GAA channel structure 322 that includes the second material layer 324, the second gate dielectric 326, and the second metal 328 is formed. Herein, the second material layers 324 function as second channel regions. Moreover, a second transistor 320 that includes two second GAA channel structures 322 is formed (based on the original substack 310'). In the primary example, the second gate dielectric 326 is a high-k dielectric, and can be a same material as the first gate dielectric 315, such as hafnium oxide. The second metal 328 is a p-type gate metal electrode such as titanium nitride. On the PMOS side (Stack B), high-k deposition can be executed as well as dual metal gate electrode sequence. At this point in processing, PMOS transistors 320 are complete. An additional deposition of the filler material 341 can be executed followed by polishing. The result is Si channels (e.g., first material layers 313) for NMOS transistors (310) and SiGe2 channels (e.g., the second material layers 324) for PMOS transistors (320). Note that PMOS and NMOS channels can be on different nanoplanes (e.g., the first material layers 313 and the second material layers 324), one step from each other. Processing flow can then continue with wiring the GAA transistors (310 and 320) into various circuits (logic or memory).

As can be appreciated, various embodiments of the flow can be enabled herein because various materials can be used in the initial stack as has been described for FIG. 1. Hence, various devices 300 can be formed, similar to the semiconductor device 100. In one example, the flow begins with alternating stacks of Si/Ge/Si/Ge and then forms stack of Si nanoplanes (NMOS devices) adjacent to a stack of Ge nanoplanes (PMOS devices). In another example, the flow begins with alternating stacks of doped Si/silicon-germanium/doped Si/silicon-germanium and then forms a stack of Si nanoplanes with a different $V_t$ (NMOS devices) adjacent to a stack of doped SiGe nanoplanes with a different $V_t$ (PMOS devices). The various combinations can provide different threshold voltages and both high and low voltage transistors in adjacent stacks, and combinations of these various embodiments can be made to provide a shared stack. Moreover, techniques herein can cover the case where two or more common stacks can be used in a same circuit to cover all high-voltage (HV), low-voltage (LV), and different $V_t$ logic circuit requirements. Accordingly, techniques herein enable 3D logic to make any type of 3D circuit including but not limited to integrated 3D logic, 3D memory, and microprocessors.

The various embodiments described herein offer several advantages. For example, techniques herein provide a universal or common stack that can make optimum channel elements for maximum mobility in each stack, which greatly enhances performance for 3D NMOS and 3D PMOS. Other advantages include reducing a number of epitaxial process steps. Independent control of high-k gate dielectric and metal gate electrode deposition is provided for more flexibility for choice of materials to obtain $V_t$. This provides a more cost-effective flow for making metal gate electrodes for NMOS and PMOS. Techniques herein can be used with 3D logic, 3D Memory, and 3D SRAM integration.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of fabricating a semiconductor device, the method comprising:
    forming an initial stack of layers over a substrate, the initial stack of layers alternating between a first material layer and a second material layer, the second material layer having a different composition from the first material layer;
    patterning the initial stack of layers so that the initial stack of layers is divided into a first stack and a second stack, wherein the first stack and the second stack are adjacent to each other;
    forming first gate-all-around (GAA) transistors in the first stack by using the first material layers as respective channel regions for the first GAA transistors and using the second material layers as respective replacement gates for the first GAA transistors; and
    forming second GAA transistors in the second stack by using the second material layers as respective channel regions for the second GAA transistors and using the first material layers as respective replacement gates for the second GAA transistors, wherein the second GAA transistors are vertically offset from the first GAA transistors.

2. The method of claim 1, wherein forming the first GAA transistors comprises:
    forming a protective layer over the second stack so that the second stack is covered by the protective layer;
    removing a portion of a filler material that abuts the first stack so that the first stack is exposed from sides, the filler material surrounding the first stack;
    removing end portions of the second material layers of the first stack to form indentations by selective etching;
    forming inner spacers in the indentations by selective deposition; and
    forming local source and drain regions on ends of the first material layers of the first stack.

3. The method of claim 2, further comprising:
    depositing the filler material to cover the sides and a top of the first stack;
    patterning the filler material so that the top of the first stack is exposed;
    removing the second material layers from the first stack;
    forming gate layers over the first material layers; and
    depositing the filler material to fill the first stack.

4. The method of claim 2, wherein:
    one or more of the local source regions merge with at least one neighboring local source region to form a common source region, and
    one or more of the local drain regions merge with at least one neighboring local drain region to form a common drain region.

5. The method of claim 1, wherein forming the second GAA transistors comprises:
    forming a protective layer over the first stack so that the first stack is covered by the protective layer;
    removing a portion of a filler material that abuts the second stack so that the second stack is exposed from sides, the filler material surrounding the second stack;
    removing end portions of the first material layers of the second stack to form indentations by selective etching;
    forming inner spacers in the indentations by selective deposition; and
    forming local source and drain regions on ends of the second material layers of the second stack.

6. The method of claim 5, further comprising:
    depositing the filler material to cover the sides and a top of the second stack;
    patterning the filler material so that the top of the second stack is exposed;
    removing the first material layers from the second stack;
    forming gate layers over the second material layers; and
    depositing the filler material to fill the second stack.

7. The method of claim 5, wherein:
    one or more of the local source regions merge with at least one neighboring local source region to form a common source region, and
    one or more of the local drain regions merge with at least one neighboring local drain region to form a common drain region.

8. The method of claim 1, wherein one or more of the first GAA transistors are connected with one or more of the second GAA transistors.

9. The method of claim 1, further comprising forming at least one of an etch stop layer on a bottom of the initial stack of layers or a cap layer on a top of the initial stack of layers.

10. The method of claim 1, wherein:
    the first GAA transistors are stacked in a thickness direction of the substrate and electrically isolated from each other, and
    the second GAA transistors are stacked in the thickness direction of the substrate and electrically isolated from each other.

11. A method of fabricating a semiconductor device, the method comprising:
    forming an initial stack of layers over a substrate, the initial stack of layers including a plurality of substacks that alternate between a first material layer and a second material layer having a different composition from the first material layer, the plurality of substacks being separated from each other in a height direction;
    patterning the initial stack of layers so that the initial stack of layers is divided into a first stack and a second stack, wherein the first stack and the second stack are adjacent to each other;

forming first gate-all-around (GAA) transistors in the first stack by using the first material layers as respective channel regions for the first GAA transistors and using the second material layers as respective replacement gates for the first GAA transistors; and forming second GAA transistors in the second stack by using the second material layers as respective channel regions for the second GAA transistors and using the first material layers as respective replacement gates for the second GAA transistors, wherein the second GAA transistors are vertically offset from the first GAA transistors.

12. The method of claim 11, wherein:

the first GAA transistors are stacked in a thickness direction of the substrate and electrically isolated from each other, and the second GAA transistors are stacked in the thickness direction of the substrate and electrically isolated from each other.

13. A semiconductor device, comprising:

a substrate;

a first stack of first gate-all-around (GAA) transistors positioned over one another along a thickness direction of the substrate; and a second stack of second GAA transistors positioned over one another along the thickness direction, the first and second GAA transistors being adjacent to each other in a direction along a surface of the substrate, wherein each of the first GAA transistors is vertically offset from a respective adjacent second GAA transistor of the second stack.

14. The semiconductor device according to claim 13, wherein:

at least one of the first GAA transistors comprises a first channel region, a first gate surrounding the first channel region, and first source and drain regions on ends of the first channel region, and at least one of the second GAA transistors comprises a second channel region, a second gate surrounding the second channel region, and second source and drain regions on ends of the second channel region.

15. The semiconductor device according to claim 14, wherein:

each of the first GAA transistors is vertically offset from a respective adjacent second GAA transistor of the second stack by a thickness of a respective first or second channel region.

16. The semiconductor device according to claim 14, wherein one or more of the first channel regions are chemically different from other first channel regions.

17. The semiconductor device according to claim 14, wherein one or more of the second channel regions are chemically different from other second channel regions.

18. The semiconductor device according to claim 14, wherein one or more of the first GAA transistors have a different number of first channel regions from other first GAA transistors.

19. The semiconductor device according to claim 14, wherein one or more of the second GAA transistors have a different number of second channel regions from other GAA second transistors.

20. The semiconductor device according to claim 14, wherein:

the first GAA transistors are NMOS, the first channel regions comprise at least one of single-crystal silicon or silicon carbide, the second GAA transistors are PMOS, and the second channel regions comprise at least one of silicon-germanium or germanium.

21. The semiconductor device according to claim 14, wherein:

the first GAA transistors are PMOS, the first channel regions comprise at least one of silicon-germanium or germanium, the second GAA transistors are NMOS, and the second channel regions comprise at least one of single-crystal silicon or silicon carbide.

22. The semiconductor device according to claim 14, further comprising:

insulating layers that separate the first or second GAA transistors from each other; and inner spacers that separate the first or second gates from the corresponding first or second source and drain regions.

23. The semiconductor device according to claim 13, wherein:

the first stack of first GAA transistors are electrically isolated from each other, and the second stack of second GAA transistors are electrically isolated from each other.

* * * * *

UNITED STATES PATENT AND TRADEMARK OFFICE
CERTIFICATE OF CORRECTION

PATENT NO. : 11,631,671 B2  
APPLICATION NO. : 17/136820  
DATED : April 18, 2023  
INVENTOR(S) : Fulford et al.

Page 1 of 1

It is certified that error appears in the above-identified patent and that said Letters Patent is hereby corrected as shown below:

On the Title Page

Column 1, in Item (72), in "Inventors", Line 7, delete "Mechanicsville," and insert
-- Mechanicville, --, therefor.

Signed and Sealed this
Twenty-first Day of November, 2023

Katherine Kelly Vidal
*Director of the United States Patent and Trademark Office*